(12) United States Patent
Young et al.

(10) Patent No.: US 9,539,615 B2
(45) Date of Patent: Jan. 10, 2017

(54) COATING METHOD AND COATING APPARATUS

(75) Inventors: Edward Willem Albert Young, Maastricht (NL); Erik Dekempeneer, Malle (BE); Antonius Maria Bernardus van Mol, Eindhoven (NL); Herbert Lifka, Son en Breugel (NL); Peter van de Weijer, Heeze (NL); Bernhard Sailer, Ranspach-le-Haut (FR); Emilie Galand, Saint Louis la Chaussee (FR); Richard Frantz, Village Neuf (FR); Dimiter Lubomirov Kotzev, Basel (CH); Mohammed Zoubair Cherkaoui, Allschwil (CH)

(73) Assignees: Nederlandse Organisatie voor toegepast-natuurwetenschappelijk Onderzoek TNO, Delft (NL); Huntsman Advanced Materials (Switzerland) GmbH, Basel (CH)

( * ) Notice: Subject to any disclaimer, the term of this patent is extended or adjusted under 35 U.S.C. 154(b) by 1226 days.

(21) Appl. No.: 13/394,271

(22) PCT Filed: Sep. 6, 2010

(86) PCT No.: PCT/NL2010/050560
§ 371 (c)(1),
(2), (4) Date: May 31, 2012

(87) PCT Pub. No.: WO2011/028119
PCT Pub. Date: Mar. 10, 2011

(65) Prior Publication Data
US 2012/0276299 A1    Nov. 1, 2012

(30) Foreign Application Priority Data

Sep. 7, 2009   (EP) ..................................... 09169668

(51) Int. Cl.
*C23C 16/44* (2006.01)
*B05D 7/04* (2006.01)
(Continued)

(52) U.S. Cl.
CPC . *B05D 7/04* (2013.01); *B05C 9/06* (2013.01); *C23C 14/56* (2013.01); *C23C 16/345* (2013.01);
(Continued)

(58) Field of Classification Search
None
See application file for complete search history.

(56) References Cited

U.S. PATENT DOCUMENTS 4,462,332 A  *  7/1984  Nath et al. .................... 118/718
4,702,963 A      10/1987  Phillips et al.
(Continued)

FOREIGN PATENT DOCUMENTS

CN      101520576        9/2009
EP      2085497 A1  *   8/2009
(Continued)

OTHER PUBLICATIONS

Office Action from TW 099130123 dated Dec. 10, 2014 with English Translation.
(Continued)

*Primary Examiner* — Charles Capozzi
(74) *Attorney, Agent, or Firm* — Swanson & Bratschun, L.L.C.

(57) ABSTRACT

An apparatus is described for coating a flexible substrate with at least a first organic layer and a first inorganic layer. The apparatus comprises a first and a second chamber and an atmosphere decoupling slot between the first and the second chamber. A printing facility is arranged in the first chamber, for printing the flexible substrate with a mixture comprising
(Continued)

at least one precursor for a polymer, oligomer or a polymer network and a polymerization initiator. A curing facility is arranged in the first chamber, for curing the deposited mixture, therewith forming the at least first organic layer. A vapor deposition facility is arranged in the second chamber, for depositing the at least first inorganic layer at the substrate provided with the at least first organic layer. The apparatus comprises a facility for guiding the flexible substrate along the printing facility, along the curing facility and via the atmosphere decoupling slot along the vapor deposition facility.

7 Claims, 7 Drawing Sheets

(51) Int. Cl.
| | | |
|---|---|---|
| B05C 9/06 | (2006.01) | |
| C23C 14/56 | (2006.01) | |
| C23C 16/34 | (2006.01) | |
| C23C 16/54 | (2006.01) | |
| H01J 37/18 | (2006.01) | |
| H01J 37/32 | (2006.01) | |
| B05D 3/04 | (2006.01) | |

(52) U.S. Cl.
CPC ........... C23C 16/545 (2013.01); H01J 37/185 (2013.01); H01J 37/3277 (2013.01); B05D 3/0493 (2013.01); B05D 2252/02 (2013.01)

(56) References Cited

U.S. PATENT DOCUMENTS

| | | | |
|---|---|---|---|
| 5,168,514 A | 12/1992 | Horton, Jr. et al. | |
| 5,168,541 A | 12/1992 | Booth | |
| 5,440,446 A | 8/1995 | Shaw et al. | |
| 5,520,740 A * | 5/1996 | Kanai et al. | .................. 118/718 |
| 5,681,666 A | 10/1997 | Treger et al. | |
| 5,686,360 A | 11/1997 | Harvey, III et al. | |
| 5,725,909 A | 3/1998 | Shaw et al. | |
| 6,268,695 B1 | 7/2001 | Affinito | |
| 6,413,645 B1 | 7/2002 | Graff et al. | |
| 6,465,953 B1 | 10/2002 | Duggal | |
| 6,652,654 B1 * | 11/2003 | Propp et al. | .................. 118/718 |
| 6,866,901 B2 | 3/2005 | Burrows et al. | |
| 2003/0160243 A1 | 8/2003 | Middelman et al. | |
| 2005/0129841 A1 * | 6/2005 | McCormick et al. | .......... 427/66 |
| 2005/0249875 A1 * | 11/2005 | Sasaki | .................... C23C 14/562 |
| | | | 427/248.1 |
| 2006/0117988 A1 * | 6/2006 | Mikhael et al. | ............. 106/1.05 |
| 2007/0256934 A1 | 11/2007 | Perata et al. | |
| 2008/0084150 A1 | 4/2008 | Cok | |
| 2009/0196997 A1 * | 8/2009 | Nakagame et al. | ........... 427/294 |
| 2009/0320747 A1 * | 12/2009 | Hayashi | ................ B05C 1/0821 |
| | | | 118/50 |

FOREIGN PATENT DOCUMENTS

| | | | |
|---|---|---|---|
| EP | 2113310 A1 | 11/2009 | |
| JP | A05-090176 | 9/1983 | |
| JP | WO 2008018297 A1 * | 2/2008 | ........... B05C 1/0821 |
| JP | 2009-179855 | 8/2009 | |
| TW | 2007/24697 | 7/2007 | |
| TW | 2008/44250 | 11/2008 | |
| WO | WO 2004/097846 | 11/2004 | |
| WO | WO 2009/009306 | 1/2009 | |

OTHER PUBLICATIONS

International Search Report, from PCT/NL2010/050560, dated Nov. 2, 2010.
Notice of Reasons for Rejection received in corresponding Japanese patent application No. JP 2012-527840, dated Feb. 3, 2014.

* cited by examiner

0
COATING METHOD AND COATING APPARATUS

RELATED APPLICATIONS

This application is a 35 U.S.C. §371 national phase application of PCT/NL2010/050560 (WO 2011/028119), filed on Sep. 6, 2010, entitled "Coating Method and Coating Apparatus", which application claims priority from European Application No. 09169668.2, filed Sep. 7, 2009, which is incorporated herein by reference in its entirety.

BACKGROUND OF THE INVENTION

Field of the Invention

The present application relates to a coating method.

The present application further relates to a coating apparatus.

Related Art

Many products, such as food products, electronic components and the like, require an enclosure that protects them from influences by moisture, oxygen, hydrogen and/or other substances. Barrier layers comprising alternating organic and inorganic layers have been proven suitable as an enclosure. The material in the inorganic layers provides the highest barrier against said substances, but these layers usually have defects via which these substances may still leak. An organic layer decouples mutually subsequent inorganic layers so that the substances may only penetrate via a tortuous path, which inhibits diffusion.

U.S. Pat. No. 5,725,909 describes an apparatus and a method for coating a sheet substrate with acrylate and oxygen barrier layers in a continuous process. In the apparatus described therein with reference to FIG. 4, the sheet is guided along a rotatable drum. While being guided around the drum an acrylate layer is deposited at the sheet by a flash evaporator, and polymerized by an UV source. A further deposition station deposits a barrier material e.g. by plasma deposition, vacuum deposition or the like. This is followed by a further evaporator that deposits a further acrylate layer that is subsequently polymerized.

It is a disadvantage of the known apparatus and method that it is only possible to apply relatively thin organic layers, e.g. of less than a micrometer. Also, in order to be capable to apply UV-curing to the acrylate layer, this layer should in addition to an acrylate monomer or other precursor comprise a photo-initiator. These components should be simultaneously evaporated, which implies the requirement that they have a comparable vapor pressure. Relatively thick organic layers are desired as they can better cover irregularities in the inorganic layers. Moreover a relatively thick organic layer e.g. thicker than about 10 µm is very suitable to embed functional particles, such as getter materials and optically active particles such as microlenses or scattering particles.

U.S. Pat. No. 5,725,909 also mentions spraying as a method to apply a thicker acrylate layer, e.g. of 25 µm. However, when replacing the flash evaporator of FIG. 4, by spraying nozzles, the sprayed substances will also distribute in the atmosphere of the vacuum chamber, so that the conditions for deposition of the oxygen barrier material are no longer met.

SUMMARY OF THE INVENTION

It is an object of the present invention to provide an improved apparatus for coating a flexible substrate with at least a first organic layer and a first inorganic layer in a continuous process. It is a further object of the present invention to provide an improved method for coating a flexible substrate with at least a first organic layer and a first inorganic layer in a continuous process.

According to a first aspect of the invention there is provided an apparatus for coating a flexible substrate with at least a first organic layer and a first inorganic layer, the apparatus comprising a first and a second chamber, an atmosphere decoupling slot between the first and the second chamber, a depositing facility arranged in the first chamber, for depositing a curable mixture at the substrate, the curable mixture comprising at least one precursor of polymer, oligomer or a polymer network and/or an initiator of polymerization as its components, a curing facility arranged in the first chamber, for curing the deposited mixture, therewith forming the at least first organic layer, a vapor deposition facility arranged in the second chamber, for depositing the at least first inorganic layer at the substrate provided with the at least first organic layer, a facility for guiding the flexible substrate from one of the first chamber and the second chamber via the atmosphere decoupling slot to the other one of the first chamber and the second chamber.

According to a second aspect of the invention there is provided a coating method for coating a flexible substrate with at least a first organic layer and a first inorganic layer, comprising the steps of:

providing a flexible substrate of a flexible material, guiding the flexible substrate through one of a first chamber and a second chamber, guiding the flexible substrate via an atmosphere decoupling slot to the other one of the first and the second chamber, in said first chamber depositing a layer of a curable mixture at the substrate, the curable mixture comprising at least one precursor of polymer, oligomer or a polymer network and/or an initiator of polymerization as its components, in said first chamber curing the printed layer to form the at least first organic layer, guiding the flexible substrate via an atmosphere decoupling slot to a second chamber, in said second chamber applying the at least first inorganic layer by a vapor deposition method.

The atmosphere decoupling slot enables the subsequent application of different coating techniques for the inorganic and the organic layer which operate in different atmospheric pressure regimes. In an embodiment the one chamber is the first chamber and the other one chamber is the second chamber and the at least first inorganic layer is applied at the at least first organic layer. In another embodiment the one chamber is the second chamber and the other one chamber is the first chamber and the at least first organic layer is applied at the at least first inorganic layer.

A chamber may have different compartments. For example, the first chamber may be divided in a first compartment for printing and a second compartment for curing. An additional atmosphere decoupling slot may be present between subsequent compartments.

The apparatus and method according to the first and the second aspect of the invention may also be used if the substrate already has a stack of layers. For example the apparatus may be used first to provide a substrate with a first barrier structure with at least a first organic and a first inorganic layer. Subsequently an electronic device, such as a (O)LED, a photo voltaic cell, an electro chrome device or a battery may be applied at the substrate so obtained. The apparatus and method according to the first and second aspect of the invention may then be used to apply a second barrier structure with at least a first organic and a first inorganic layer over the electronic device. The electronic device is then encapsulated by the first and the second barrier layer.

The flexible substrate can be PET, PEN or any kind of flexible material. Optionally the flexible substrate could have been coated first with an organic printed layer.

A precursor for a polymer, oligomer or a polymer network is a substance that can be converted into a polymer, oligomer or a polymer network after a subsequent curing step. The step of curing is induced by the initiator present in the mixture under influence of supplied energy. The supplied energy stimulates the initiator to generate activated species. Those activated species initiate the polymerization of the polymerizable components of the mixture, this process is often referred to as "curing." Upon cure, the polymerisable components of the mixture crosslink to form a solid surface coating. The coatings may include additives such as stabilizers, modifiers, tougheners, antifoaming agents, leveling agents, thickening agents, flame retardants, antioxidants, pigments, dyes, fillers and combination thereof. Polymer-based UV-curable coating compositions can be formulated free of any solvents. This is advantageous. A solvent when used would need to have a relatively low vapor pressure, implying a slow rate of evaporation. This would necessitate a very slow transport of the flexible substrate and or a relatively long portion of the flexible substrate to be subjected to evaporation process.

In an embodiment the mixture of components has a vapor pressure during execution of the method of at most 10 mbar. This allows an easy evacuation of the first chamber to a pressure level at which the flow occurring through the atmosphere decoupling slot is a molecular flow. Preferably the mixture of said components has a vapor pressure in said range at room temperature (20° C.), so that cooling of the first chamber is not necessary. A reduction of the vapor pressure below 1 mbar would require a strong limitation of the selection of components for the mixture, or require cooling of the first chamber and would not result in practical simplification of the vacuum equipment.

The depositing facility, could be a spray coating device, but is preferably a printing facility, most preferably a contact printing device. Contact printing, such as gravure coating and screen coating limits the distribution of the mixture to be printed in the atmosphere of the first chamber.

In an embodiment the mixture of components has a viscosity in a range between 10 and 1000 mPa·s during execution of the method. This is a suitable viscosity range for most printing methods. Preferably the mixture of components has a viscosity in this range at room temperature (20° C.), so that temperature control of the first chamber is not necessary. It is noted that some methods, such as rotary screen printing, also are suitable for relatively high viscosity up to 10.000 mPa·s, e.g. 3000 mPa·s.

In the method according to the second aspect of the invention energy may be supplied in various ways, e.g. by supplying heat, by thermal induction etc.

Most preferably energy is supplied by radiation, preferably photon-radiation, preferably UV radiation. By supplying the energy for activation of the initiator by radiation a rapid curing of the printed organic layer is achieved. In particular curing with UV-radiation is a fast process. This makes it possible that the substrate can be transported rapidly through the first chamber and that the first chamber can have a relatively small volume. A rapid transport of the substrate is attractive for economic reasons. A first chamber having a relatively small volume can be easily kept evacuated. The absence of solvents in the printed mixture enables a low vapor pressure in the process of printing so that the flexible substrate can be directly transported via the atmospheric decoupling slot to the second chamber where vacuum deposition of the inorganic layer takes place. An atmospheric decoupling slot is defined herein as a slit having a cross-section that is sufficient high and wide to permit the flexible substrate to pass through, but sufficiently narrow and long to decouple the chambers atmospherically. Atmospheric decoupling is understood to be allowing the pressure in the second chamber to be significantly lower than the pressure in the first chamber, i.e. at least 100 times lower.

The atmosphere decoupling slot needs to have a height greater than the thickness of the foil to prevent friction between the atmosphere decoupling slot and therewith a damaging of the substrate and the layers coated thereon. Preferably the atmosphere decoupling slot has a height x in the range of 2 to 4 times the thickness of the flexible substrate. A height substantially less than 2, e.g. less than 1.5 would require a very precise alignment to prevent friction between the atmosphere decoupling slot and the flexible substrate and the layers coated thereon. For the purpose of easiness of alignment it is not necessary to choose the height of the atmosphere slot substantially greater than 4 times the thickness of the foil, e.g. greater than 5 times. Moreover, as the molar conductance of the atmosphere decoupling slot is approximately proportional to the square of the height of the slot this would necessitate a relatively great length of the slot.

The length L divided by the height x of the atmosphere decoupling slot preferably is in a range between 100 and 5000. A length less than 100 times the height would require a strong pumping facility to remove contaminants from the first chamber that pass via the atmosphere decoupling slot. For practical purposes the length is at most 5000 times the height. Although further increasing the length results in a further improvement of the atmospheric decoupling this goes along with very narrow manufacturing tolerances and strict requirements for the alignment of the atmosphere decoupling slot.

An embodiment of the apparatus according to the first aspect is characterized in that the printing facility is a contact printing arrangement. Examples of contact-printing are roto screen printing and roto gravure printing. Contact printing minimizes the amount of the mixture that comes into contact with the atmosphere, therewith facilitating evacuation of the first chamber.

An embodiment of the apparatus is characterized in that the atmosphere decoupling slot comprises one or more evacuation channels that are coupled to an evacuation device. By providing for additional evacuation within the atmosphere decoupling slot the requirements with respect to the dimensions for the atmosphere decoupling slot may be somewhat released, e.g. the atmosphere decoupling slot may be shorter or higher, therewith making transfer of the flexible substrate through the atmosphere decoupling slot more easy.

An embodiment of the apparatus according to the first aspect of the invention further comprises a condensation channel arranged between the first chamber and the atmosphere decoupling slot. Vaporized substances condensate in the condensation channel and are so prevented to reach the second chamber. Therewith the requirements for the atmospheric decoupling slot may be relaxed.

In an embodiment of the apparatus according to the first aspect of the invention the atmosphere decoupling slot comprises one or more pairs of cylindrical rollers between which the flexible substrate is guided. In this way the flexible substrate can pass easily through the atmosphere decoupling slot, while the gaseous substances from the first chamber are barred.

In an embodiment of the method according to the second aspect the curable mixture is preferably a photocurable composition comprising at least one cationically curable compound and a cationic photoinitiator, and/or at least one radically curable compound and radical photoinitiator.

The at least one cationically curable compound can include at least one cationically curable compound or resin characterized by having functional groups capable of reacting via or as a result of a ring-opening mechanism to form a polymeric network. Examples of such functional groups include oxirane-(epoxide), oxetane-, tetrahydrofuran- and lactone-rings in the molecule. Such compounds may have an aliphatic, aromatic, cycloaliphatic, araliphatic or heterocyclic structure and they may contain the ring groups as side groups, or the epoxide group can form part of an alicyclic or heterocyclic ring system. The photocurable composition may further include at least one cationic photoinitiator. The cationic photoinitiator may be chosen from those commonly used to initiate cationic photopolymerization. Examples include onium salts with anions of weak nucleophilicity, e.g., halonium salts, iodosyl salts, sulfonium salts, sulfoxonium salts, or diazonium salts. Metallocene salts are also suitable as photoinitiators. Onium salt and metallocene salt photoinitiators are described in U.S. Pat. No. 3,708,296; J. V. Crivello, "Photoinitiated Cationic Polymerization," UV Curing: Science & Technology, (S. P. Pappas, ed., Technology Marketing Corp. 1978) and J. V. Crivello and K. Dietliker, "Photoinitiators for Cationic Polymerisation," Chemistry and Technology of UV & EV Formulation for Coatings, Inks & Paints 327-478 (P. K. Oldring, ed., SITA Technology Ltd 1991), each of which is incorporated herein by reference.

The photocurable composition may alternatively or in addition include one or more radically polyerizable (acrylate-containing) compounds. The acrylate-containing compound for use in the method according to second aspect of the present invention is preferably ethylenically unsaturated. More preferably, the acrylate-containing compound is a (meth)acrylate. "(Meth)acrylate" refers to an acrylate, a methacrylate, or a mixture thereof. The acrylate-containing compound may include at least one poly(meth)acrylate, e.g., a di-, tri-, tetra- or pentafunctional monomeric or oligomeric aliphatic, cycloaliphatic, or aromatic (meth)acrylate. Alternatively or in addition the photocurable composition at least one free radical photoinitiator. The free radical photoinitiator may be chosen from those commonly used to initiate radical photopolymerization. Examples of free radical photoinitiators include benzoins, e.g., benzoin, benzoin ethers such as benzoin methyl ether, benzoin ethyl ether, benzoin isopropyl ether, benzoin phenyl ether, and benzoin acetate; acetophenones, e.g., acetophenone, 2,2-dimethoxyacetophenone, and 1,1-dichloroacetophenone; benzil ketals, e.g., benzil dimethylketal and benzil diethyl ketal; anthraquinones, e.g., 2-methylanthraquinone, 2-ethylailthraquinone, 2-tertbutylanthraquinone, 1-chloroanthraquinone and 2-amylanthraquinone; triphenylphosphine; benzoylphosphine oxides, e.g., 2,4,6-trimethylbenzoy-diphenylphosphine oxide (Luzirin TPO); bisacylphosphine oxides; benzophenones, e.g., benzophenone and 4,4'-bis(N,N'-dimethylamino)benzophenone; thioxanthones and xanthones; acridine derivatives; phenazine derivatives; quinoxaline derivatives; 1-phenyl-1,2-propanedione 2-O-benzoyl oxime; 4-(2-hydroxyethoxy)phenyl-(2-propyl)ketone (Irgacure® 2959); 1-aminophenyl ketones or 1-hydroxy phenyl ketones, e.g., 1-hydroxycyclohexyl phenyl ketone, 2-hydroxyisopropyl phenyl ketone, phenyl 1-hydroxyisopropyl ketone, and 4-isopropylphenyl 1-hydroxyisopropyl ketone.

The photocurable composition of the present invention may additionally include other components, for example, stabilizers, modifiers, tougheners, antifoaming agents, leveling agents, thickening agents, flame retardants, antioxidants, pigments, dyes, fillers, and combinations thereof.

Stabilizers which may be added to the photocurable composition to prevent viscosity build-up during usage include butylated hydroxytoluene ("BHT"), 2,6-Di-tert-butyl-4-hydroxytoluene, hindered amines, e.g., benzyl dimethyl amine ("BDMA"), N,N-Dimethylbenzylamine, and boron complexes. These precursors are advantageous in that they have a relatively low vapor pressure at room temperature. In addition the mixture may comprise particles e.g. inorganic particles. For example inorganic particles can be $TiO_2$, $SiO_2$ or $Al_2O_3$ particles and combinations thereof.

In light emitting products, such as LEDs having an encapsulation formed by the coated substrate the addition of particles may contribute to an improved light outcoupling.

Suitable materials for the at least one inorganic layer include, but are not limited to, metal oxides, metal nitrides, metal carbides, metal oxynitrides, metal oxyborides, and combinations thereof. The metal oxides are preferably selected from silicon oxide, aluminum oxide, titanium oxide, indium oxide, tin oxide, indium tin oxide, tantalum oxide, zirconium oxide, niobium oxide, and combinations thereof. The metal nitrides are preferably selected from aluminum nitride, silicon nitride, boron nitride, and combinations thereof. The metal oxynitrides are preferably selected from aluminum oxynitride, silicon oxynitride, boron oxynitride, and combinations thereof. Opaque barrier layers can also be used in some barrier stacks. Opaque barrier materials include, but are not limited to, metals, ceramics, polymers, and cermets. Examples of opaque cermets include, but are not limited to, zirconium nitride, titanium nitride, hafnium nitride, tantalum nitride, niobium nitride, tungsten disilicide, titanium diboride, and zirconium diboride.

BRIEF DESCRIPTION OF THE DRAWINGS

These and other aspects are described in more detail with reference to the drawing. Therein.

DETAILED DESCRIPTION OF EMBODIMENTS

Figure 1:
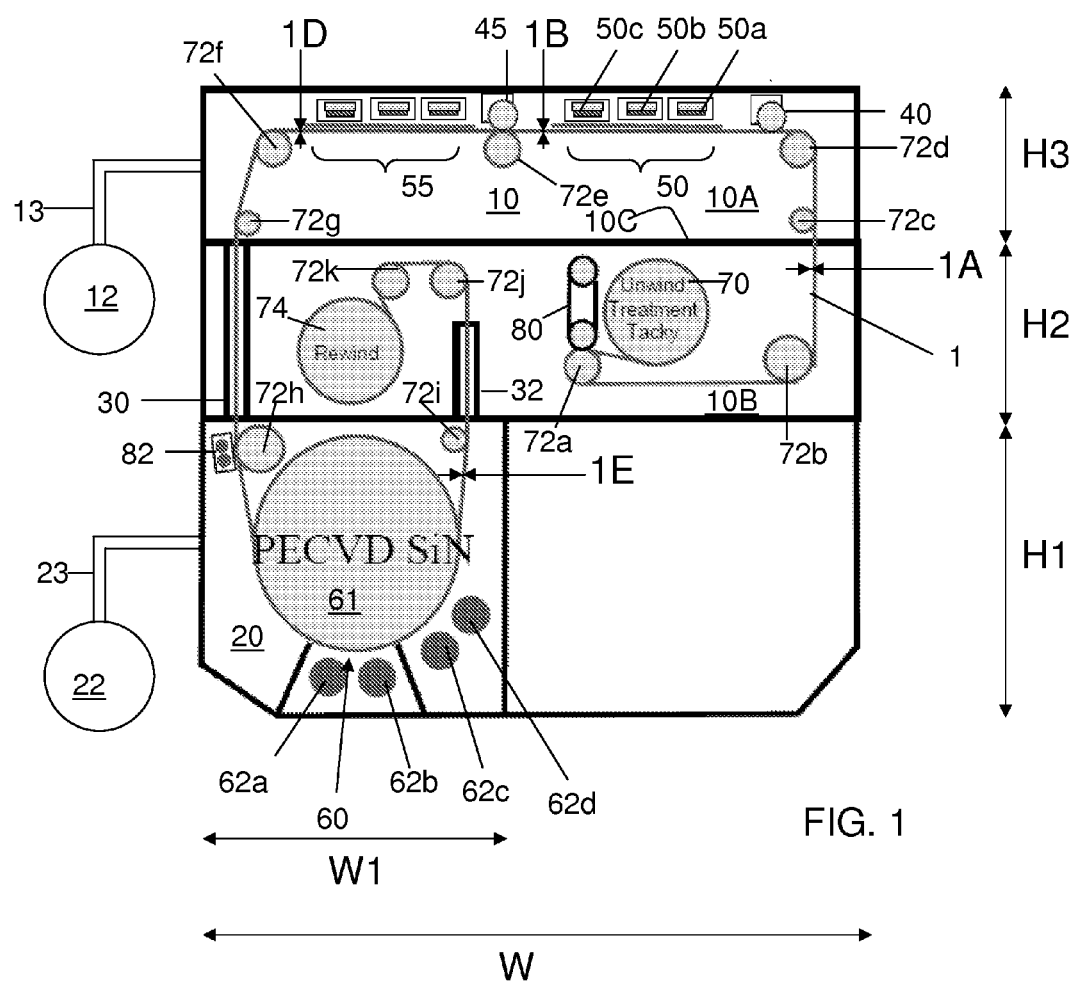
FIG. 1 shows a first embodiment of an apparatus according to the invention.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

In the drawings, the size and relative sizes of layers and regions may be exaggerated for clarity.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

FIG. 1 shows a first embodiment of an apparatus according to the invention for coating a flexible substrate 1 with at least a first organic layer and a first inorganic layer. The apparatus shown comprises a first and a second chamber 10, 20 and an atmosphere decoupling slot 30 between the first and the second chamber 10, 20. The first chamber 10 is maintained evacuated by a first evacuation pump 12 via a first evacuation tube 13 at a first pressure level P1. The second chamber 20 is maintained evacuated by a second evacuation pump 22 via a second evacuation tube 23 at a second pressure level P2. The ratio P1/P2 between the first and the second pressure level is at least 1000. The first pressure is for example maintained at a level in a range of 1 to 10 mbar, e.g. at 5 mbar. The second pressure is maintained for example at a level of 0.005 to 0.05 mbar, e.g. at 0.01 mbar.

A vacuum of about $10^{-3}$ to $10^{-4}$ mbar can be realized with a root pump. For lower vacuum, e.g. up to $10^{-6}$ mbar a turbo-molecular pump may be used.

Arranged in the first chamber 10 is a printing facility 40. The printing facility 40 is arranged for printing the flexible substrate 1 with a mixture comprising at least one precursor for a polymer and a photo initiator and or without sensitizer. Furthermore a curing facility 50 having UV-radiation sources 50a, 50b, 50c is arranged in the first chamber 10. The UV-radiation sources 50a, 50b, 50c each are formed by a Hg-bulb, each having a power of 300 W/in. However, also UV LEDs are suitable for this purpose. The apparatus additionally has a further printing facility 45 and a further curing facility 55 arranged in the first chamber 10.

In the second chamber 20 is arranged a vapor deposition facility 60 for depositing an inorganic layer. In the embodiment shown the vapor deposition facility comprises a cooling drum 61 and a plurality of evaporation devices 62a-d for evaporating the inorganic material for deposition. The apparatus further comprises a facility 70,72a-k, 74 for guiding the flexible substrate 1 along the printing facility 40, along the curing facility 50 and via the atmosphere decoupling slot 30 along the vapor deposition facility 60 in a continuous process. More in particular the facility for guiding the flexible substrate 1 comprises an unwind roller 70 comprising the unprocessed flexible substrate 1 and a rewind roller 74 for rewinding the processed flexible substrate. A first guidance roll guides the substrate along an endless tape 80 covered with a tacky material to remove dust from the substrate before processing. Guidance rolls 72b,c,d guide the substrate to the printing facility 40 and the curing facility 50. Via guidance rolls 72e, 72 the substrate is now guided along the further printing facility 45 and the further curing facility 55. With guidance rolls 72g and 72h the substrate 1 is guided through the atmosphere decoupling slot 30 to the second chamber 20. In the second chamber 20 the substrate 1 is guided along a plasma cleaning unit 82 and then transported over the cooling drum 61 along the evaporation devices 62a-d. Subsequently the substrate 1 is guided through the second atmosphere decoupling slot 32 outside the second chamber and further guided via roll 72k to the rewind roll 74. In another embodiment, the rewind roll may be arranged inside the second chamber 20.

It is noted that the process of applying at least one organic layer and at least one inorganic layer may be repeated. Instead of first applying an organic layer and subsequently an inorganic layer, alternatively an inorganic layer may be applied first.

Figure 1A:
FIG. 1A shows a cross-section of the flexible substrate in a first production stage as indicated by 1A in FIG. 1.

An example of a method according to the invention for coating a flexible substrate with at least a first organic layer and a first inorganic layer is now described. In a first step a substrate of a flexible material is provided. Suitable materials for the substrate 1 are polycarbonates (PC), polyethylenes, such as polyethylene terephthalate (PET) and polyethylene naphthalate (PEN) and polyimides such as KAPTON® for example. Other examples are high temperature polymers such as polyether sulfone (PES), polyimides, or Transphan TM (a high Tg cyclic olefin polymer available from Lofo High Tech Film, GMBH of Weil am Rhein, Germany). The substrate preferably has a thickness in a range between 25 and 500 μm. A substrate thinner than 25 μm would in practice be too fragile and substrate thicker than 500 μm would in practice be too rigid. Preferably the substrate has a thickness in the range 50 to 200 μm, e.g. of 100 μm. The substrate may have a width of some tens of cm to a few meters, for example a width in the range of 30 cm to 3 m. The substrate, preferably provided on a roll, may have a length of a few hundred meters to a few kilometers. In the embodiment shown the substrate is provided by the unwind roller 70. FIG. 1A, shows the cross-section (according to 1A in FIG. 1) of the substrate 1 as it is unwound from the unwind roller 70. After being unwound from the unwind roller 70, and being cleaned by the tape 80, the substrate 1 is guided along a printing facility 40 in a first chamber 10. It is noted that the unwind roller 70 and the cleaning facility with the tape 80 may also be arranged in the first chamber.

The printing facility 40 prints a layer 2 with a mixture comprising at least one photopolymerizable precursor and a photo initiator as its components. The mixture of components has a vapor pressure during execution of the method of at most 10 mbar.

Figure 1B:
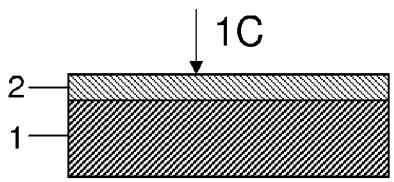
FIG. 1B shows a cross-section of the flexible substrate in a second production stage as indicated by 1B in FIG. 1.
Figure 1D:
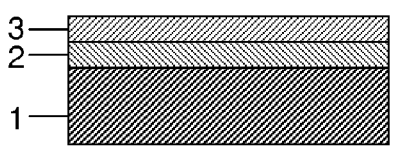
FIG. 1D shows a cross-section of the flexible substrate in a third production stage as indicated by 1C in FIG. 1.
Figure 1C:
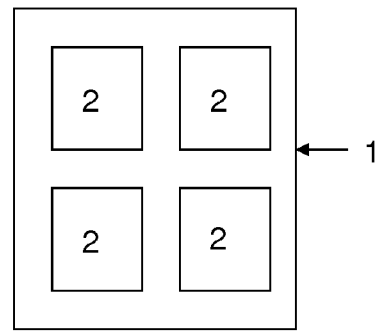
FIG. 1C shows a top-view of the flexible substrate in a second production stage as indicated by 1C in FIG. 1B

In a next step the layer 2 printed by the printing facility 40 is cured with photon radiation from the radiation sources 50a-c of the curing facility 50. FIG. 1B shows the substrate with the cured organic layer 2. The organic layer may be patterned as is illustrated in FIG. 1C which shows a portion of the surface of FIG. 1B according to view 1C. The organic layer 2 preferably has a thickness in the range of 10 to 30 μm, for example 20 μm. In the embodiment shown the substrate 1 is guided along a further printing facility 45 and a further curing facility 55 to apply a second organic layer 3 upon the first organic layer 2, as is shown in FIG. 1D.

Figure 1E:
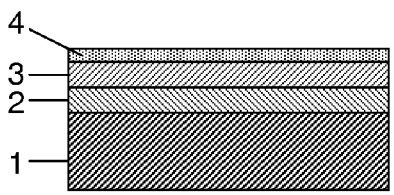
FIG. 1E shows a cross-section of the flexible substrate in a fourth production stage as indicated by 1D in FIG. 1.

The substrate having coated thereon the first and the second organic layer is now guided along guidance rolls 72f, 72g and 72h through an atmosphere decoupling slot 30 to a second chamber 20. Herein, a free surface of the coated substrate 1 is conditioned by a plasma gun 82. Subsequently the substrate is guided over the cooled drum 61 and at least one inorganic layer 4 (FIG. 1E) is applied at the free surface of the coated substrate by a vapor deposition method. In the embodiment shown an inorganic layer 4 is applied by plasma enhanced chemical vapor deposition (PECVD), resulting in the product shown in FIG. 1E. Alternatively, other vapor deposition methods may be applied such as physical vapor deposition (PVD), hybrid physical chemical vapor deposition (HPCVD), vapor phase epitaxy (VPE).

In this embodiment the an a-SiNx:H layer is deposited using PECVD process with an electron density in the order of $10^{15}$ m$^{-3}$. The evaporation devices 62a, . . . , 62d comprise a showerhead top electrode (diameter 542 mm) through which the reactive gases enter the second chamber. The second chamber is evacuated using a Pfeiffer ADS 602H roots pump. The base pressure is less than $10^{-3}$ mbar. The distance between the showerhead top electrodes of the evaporation devices and the rotating drum 61 that functions as a bottom electrode is 20 mm. The showerhead electrode is driven using a 600 W 13.56 MHz RF generator, while 500 Watt 50 kHz-460 kHz LF power can be applied to the bottom electrode 61 using an Advanced Energy LF-5 generator. Pulsed operation during deposition is possible. Without application of bias voltage the bottom electrode is grounded, which may be of importance for ion acceleration towards the substrate (the plasma potential is always positive). The bottom electrode can be heated up to 400° C.

By way of example an a-SiNx:H layer was deposited using a gas mixture of NH3 and SiH4 (4.75%) diluted in N2 for safety reasons as precursor gases. N2 is also used to further dilute the process gas mixture and to vent the second chamber 20 chamber. The gases are pre-mixed before entering the chamber through the showerhead electrode. Typical gas flows are in the order of hundreds standard cubic centimeter per minute (sccm). A process pressure typically in the range of 0.1-1.0 mbar is maintained using a throttle valve. Examples of standard deposition settings are listed in the table 1. The plasma area and volume power density at 60 W are in the order of 10 mW/cm$^2$ and 10 mW/cm$^3$ respectively.

TABLE 1

| settings | | |
|---|---|---|
| | Setting 1 | Setting 2 |
| RF (13.56 MHz) power | 60 W | 90 W (pulsed) |
| RF pulse time | | 90 ms |
| LF power | | 70 W (continuous) transformer ratio: 850 |
| LF pulse time | | 14 ms |
| N2 flow | 1110 sccm | 100 sccm |
| NH3 flow | 10 sccm | 6 sccm |
| 4.75% SiNH4 in N2 flow | 342 sccm | 343 sccm |
| Pressure | 1.27 mbar | 0.33 mbar |
| Processing time | 15 min (300 nm) | 21 min (300 nm) |
| Substrate temperature | 110° C. | 110° C. |

In an embodiment the apparatus has a width W of 2 m as well as a height H1+H2+H3 of 2 m. The first chamber 10 has a first compartment 10A having arranged therein the printing facility 40, 45 and the curing facility 50, 55. The first chamber has a second compartment 10B in which the unwind roller 70 and the rewind roller 74 are arranged. The second compartment 10B of the first chamber is arranged between the first compartment 10A of the first chamber 10 and the second chamber. A compact arrangement is achieved in that the atmosphere decoupling slot 30 extends from the second chamber 20 to the first compartment 10A of the first chamber 10. The second atmosphere decoupling slot 32 may be shorter than the first atmosphere decoupling slot 30, as the second compartment 10B is partially separated from the first compartment 10A. The first and second compartment 10A, 10B are separated by a wall 10C to reduce contamination of the first compartment 10A by outgassing of the foil from the unwind roller 70. As the compartments only have a modest pressure difference, an atmosphere decoupling slot for passing the substrate 1 between these compartments 10A, 10B is not necessary. It is sufficient if a sufficiently wide slit is present between the compartments to pass the substrate 1. An additional pump may be present to evacuate the second compartment 10B. In the embodiment shown the cooling drum 61 has a diameter of 50 cm and the second chamber 20 has a width and a height of 1 m. The depth of the apparatus (transverse to the plane of the drawing should be sufficiently large to accommodate the full width of the flexible substrate. The first and the second compartment 10A of the first chamber 10 have a height H3, H2 of 50 cm. The first and the second evacuation pump 12, 22 are turbo molecular pumps. The substrate 1 is cured over a distance of 10 cm, so that the curing time when transporting the substrate with a speed of 1 m/min is 6 s. At a higher speed it may be desirable to increase the curing distance proportionally.

Figure 2:
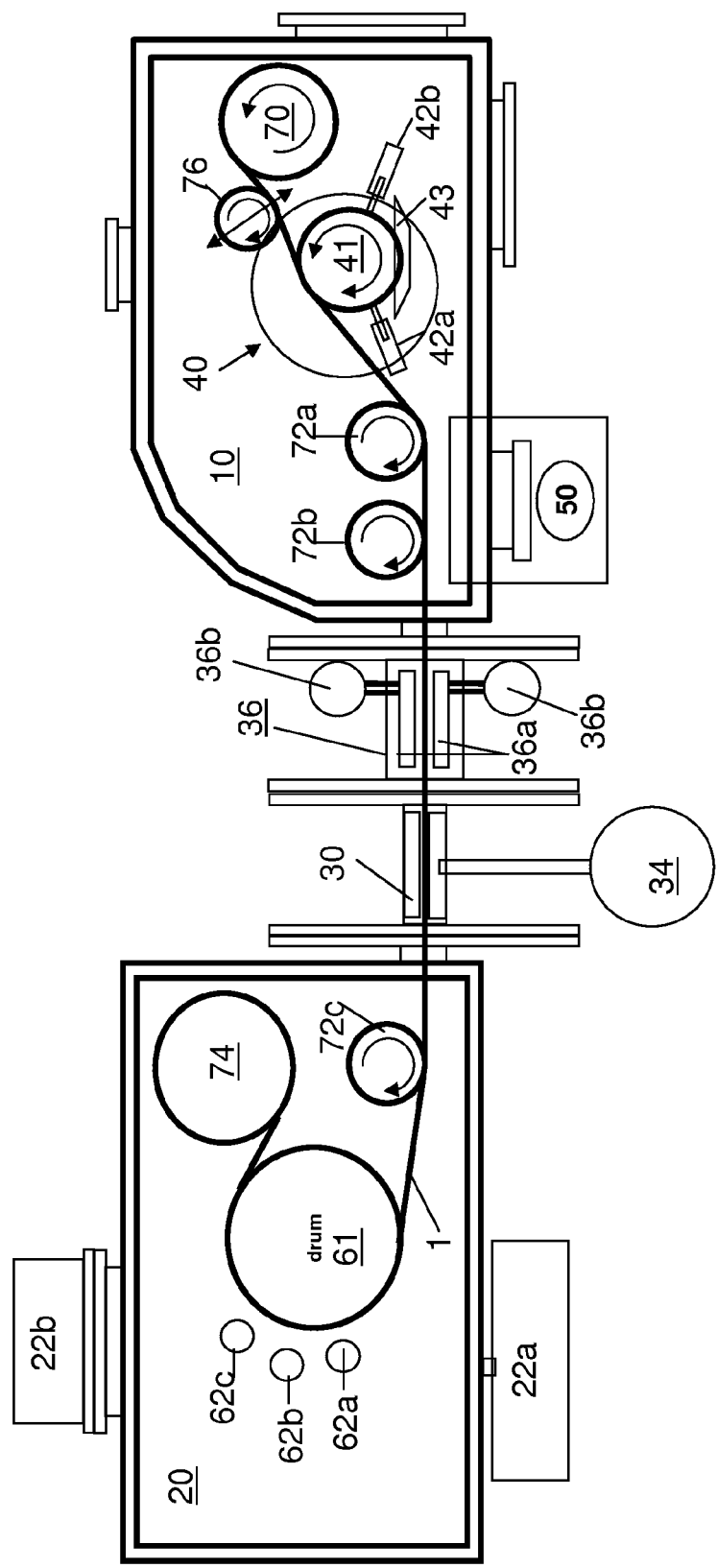
FIG. 2 shows a second embodiment of an apparatus according to the invention.
Figure 3:
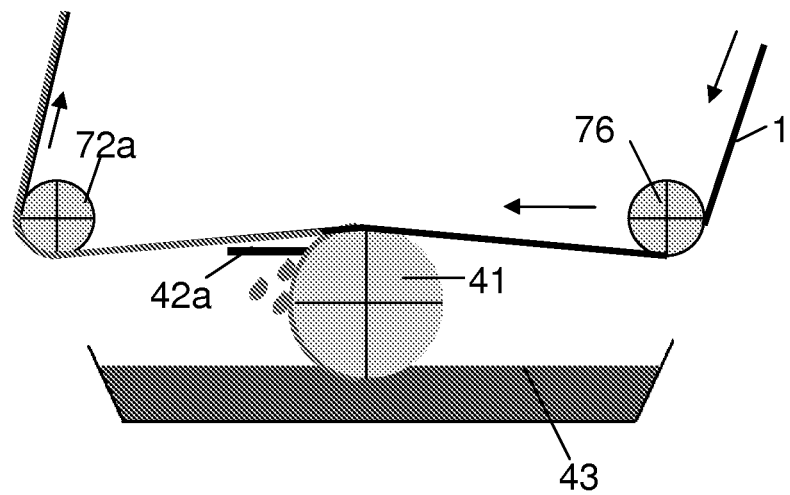
FIG. 3 shows a first detail of the embodiment of the apparatus of FIG. 2.
Figure 4B:
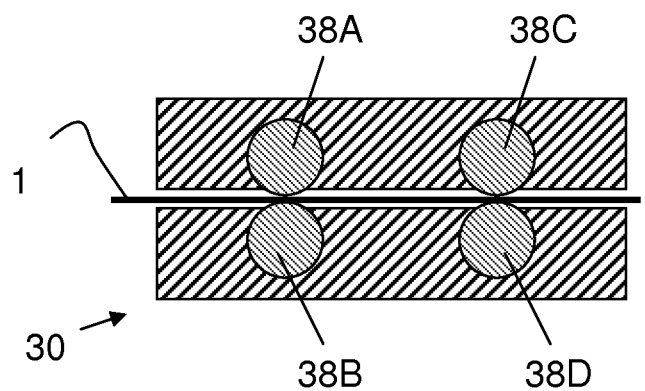
FIG. 4B shows a detail of a third embodiment of the apparatus according to the invention.
Figure 4:
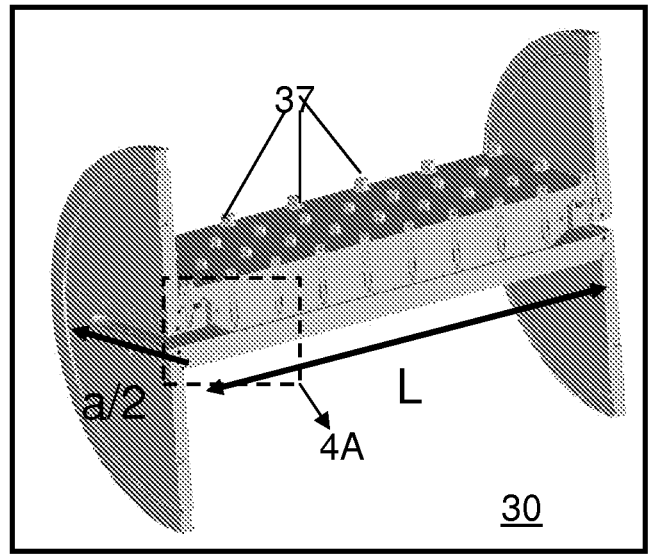
FIG. 4 shows a second detail of the embodiment of the apparatus of FIG. 2.
Figure 4A:
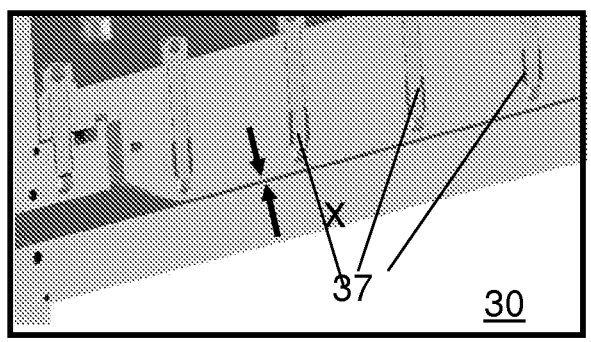
FIG. 4A shows an enlarged portion of the detail shown in FIG. 4.

FIG. 2 shows a second embodiment of an embodiment of an apparatus according to the invention for coating a flexible substrate 1 with at least a first organic layer and a first inorganic layer. In the apparatus shown in FIG. 2 the printing facility 40 (also shown schematically in FIG. 3), in this case a rotogravure printing system, comprises a driven grooved applicator roll 41 that rotates through a bath 43 with the mixture comprising the precursors for the organic layer 2 to be printed at the substrate 1. In the embodiment shown the applicator roll 41 rotates clock-wise while the substrate is transported leftward in the plane of the drawing, so that the surface of the applicator roll 41 moves in a direction contrary to the direction of the substrate 1. Roll 76 functions as a press roll that presses the substrate 1 against the applicator roll 41. Dependent on whether the applicator roll 41 rotates in one or two directions, one or more doctor blades 42a, 42b may be present to scrape a superfluous amount of mixture from the applicator roll 41. The atmosphere decoupling 30 slot used in this embodiment is shown in more detail in FIG. 4. Again a part of the atmosphere decoupling 30 slot is shown in FIG. 4A. The atmosphere decoupling 30 slot has a length L in the movement direction of the substrate, a width a transverse to the movement direction, but in the plane of the substrate and a height x in a direction transverse to the substrate.

In the relevant pressure range, the molar conductance ($C_{Mol}$) of the atmosphere decoupling slot in l/s is determined by molecular flow. This depends on the parameters a, x, L, (all in cm) according to the following relation cited in Wutz Handbuch Vakuumtechnik, 9° edition page 119.

$$C_{Mol} = 11.6ax \left[ \frac{1 + \ln\left(1 + 0.433\frac{L}{x}\right)}{1 + \frac{L}{x}} \right] \quad [1]$$

The following approximation can be made for a relatively large ration of L/x.

$$C_{Mol} = 11.6a\frac{x^2}{L}\left[1 + \ln\left(1 + 0.433\frac{L}{x}\right)\right] \quad [2]$$

In a typical embodiment the plasma sources operate at an operating pressure of $10^{-2}$ mbar and an accepted cross contamination level is less than 1%. Accordingly the leakage from the wet coating chamber 10 should stay below $10^{-4}$ mbar. Since the operating pressure in the wet coating chamber 10 is expected to be around $10^{-5}$ mbar the atmosphere decoupling slot 30 should result in a pressure reduction of a factor $10^4$.

In a practical embodiment the atmosphere decoupling slot has a width of 20 cm, a height of 0.03 cm and a length of 27.7 cm. Hence the ratio between the length L and the height h is 923, which is in the range between 100 and 5000. The pressure ($P_{out}$) in the second chamber 20 was both calculated (calc) on the basis of the above-mentioned relation [1] and measured (meas) for a sequence of pressures ($P_{in}$) of $N_2$ gas in the first chamber 10. Prior to the measurements the chamber 20 was first evacuated to a pressure Pout of $5 \cdot 10^{-6}$ mbar with a first pump 22a and during the experiments the second chamber 20 was evacuated with a second pump 22b having a constant pumping speed of 2106 l/s. The input pressure $P_{in}$ was measured with a Penning sensor and the output pressure $P_{out}$ was measured with a Pirani sensor.

TABLE 1

Measured and calculated molecular flow

| $P_{in}$ (mbar) | $P_{out}$ (meas) ($10^{-4}$ mbar) | $P_{out}$ (calc) ($10^{-4}$ mbar) | meas/calc |
|---|---|---|---|
| 1 | 0.25 | 0.25 | 1 |
| 1.5 | 0.36 | 0.38 | 0.95 |
| 2 | 0.54 | 0.5 | 1.08 |
| 2.5 | 0.75 | 0.63 | 1.19 |
| 3 | 0.86 | 0.75 | 1.15 |
| 3.5 | 1.03 | 0.88 | 1.17 |
| 4 | 1.2 | 1 | 1.2 |
| 4.5 | 1.39 | 1.13 | 1.23 |
| 5 | 1.57 | 1.25 | 1.26 |
| 5.5 | 1.75 | 1.38 | 1.27 |
| 6 | 1.93 | 1.5 | 1.29 |

As indicated in the table the used atmosphere decoupling slot allows a reduction of the pressure $P_{out}$ in the second chamber 20 due to gases from the first chamber 10 by a factor of more than $10^4$. The measurements also illustrate that the molecular flow via the channel can be predicted with sufficient accuracy by the formula [1] above.

In the above-mentioned example it was presumed that the substrate with its first coating was negligible. In practice the substrate has a finite thickness, and the height x of the atmosphere decoupling slot may be incremented with the thickness of the substrate to be used. For example in case the flexible substrate has a thickness of 0.125 mm, the height of the atmosphere decoupling slot could be 0.425 mm. Accordingly the height (x) of the atmosphere decoupling slot is 3.4 times the thickness of the flexible substrate, which is within the range of 1.5 to 5.

In the embodiment of the apparatus shown in FIG. 2 the atmosphere decoupling slot 30 comprises one or more evacuation channels 37 (See FIG. 4, 4A) that are coupled to an evacuation device 34.

In another embodiment of the apparatus shown in FIG. 2, the atmosphere decoupling slot 30 comprises one or more pairs of cylindrical rollers 38A, 38B; 38C, 38D (See FIG. 4B) between which the flexible substrate 1 is guided.

In the embodiment shown in FIG. 2 the apparatus further comprises a condensation channel 36 arranged between the first chamber 10 and the atmosphere decoupling slot 30. The condensation channel 36 comprises cooling devices 36b for cooling an inner surface 36a of the condensation channel 36. Vapors from the first chamber 10 may condensate at these surfaces 36a, before they can enter the atmosphere decoupling slot 30.

In a next experiment the two precursor mixtures (formulations), hereinafter indicated as F1 and F2 were printed by rotogravure printing to a substrate moving at a speed of 1 m/min. In this case the substrate was a PEN-foil having a thickness of 125 µm. However, also other polymer foils as PET or PC are suitable. The composition of the precursor mixtures F1, F2 and F3 are shown in the following table in terms of weight percentages.

| Composition | Mixture F1 | Mixture F2 | Mixture F3 |
|---|---|---|---|
| Epoxy resin | 50-62% | — | — |
| Epoxysilicone | — | 74.9% | 68% |

-continued

| Composition | Mixture F1 | Mixture F2 | Mixture F3 |
|---|---|---|---|
| Epoxypolybutadiene | — | — | 30% |
| 3-ethyl-3(2-ethylhexyloxymethyl)oxetane | — | 23% | — |
| Tricyclodecanedimethanol diacrylate | 14-22% | — | — |
| 3-ethyloxetane-3-methanol | 14-22% | — | — |
| Sulfonium salt mixture | 1-7% | — | — |
| Acrylate | 1-7% | — | — |
| Iodonium salt | — | 2% | 2% |
| Additive (adhesion promoter) | — | 0.1% | — |

The precursor mixtures have been de-gassed prior to the application in order to avoid splashing during transfer to the reservoir and during printing. Properties of the used materials are shown in the following table. All mixtures had a vapor-pressure of less than 5 mbar

|  | printing mixture | | | substrate |
|---|---|---|---|---|
|  | F1 | F2 | F3 | PEN |
| Surface tension (mN/m$^2$) | NA | 31.6 | 32.8 | 36-38 |
| Haze (% at 550 nm) | NA | NA | NA | 1.2 |
| Thickness (μm) | NA | NA | NA | 125 |
| Viscosity (25°, cP) | 320 | 27 | 375 | NA |

Figure 5:
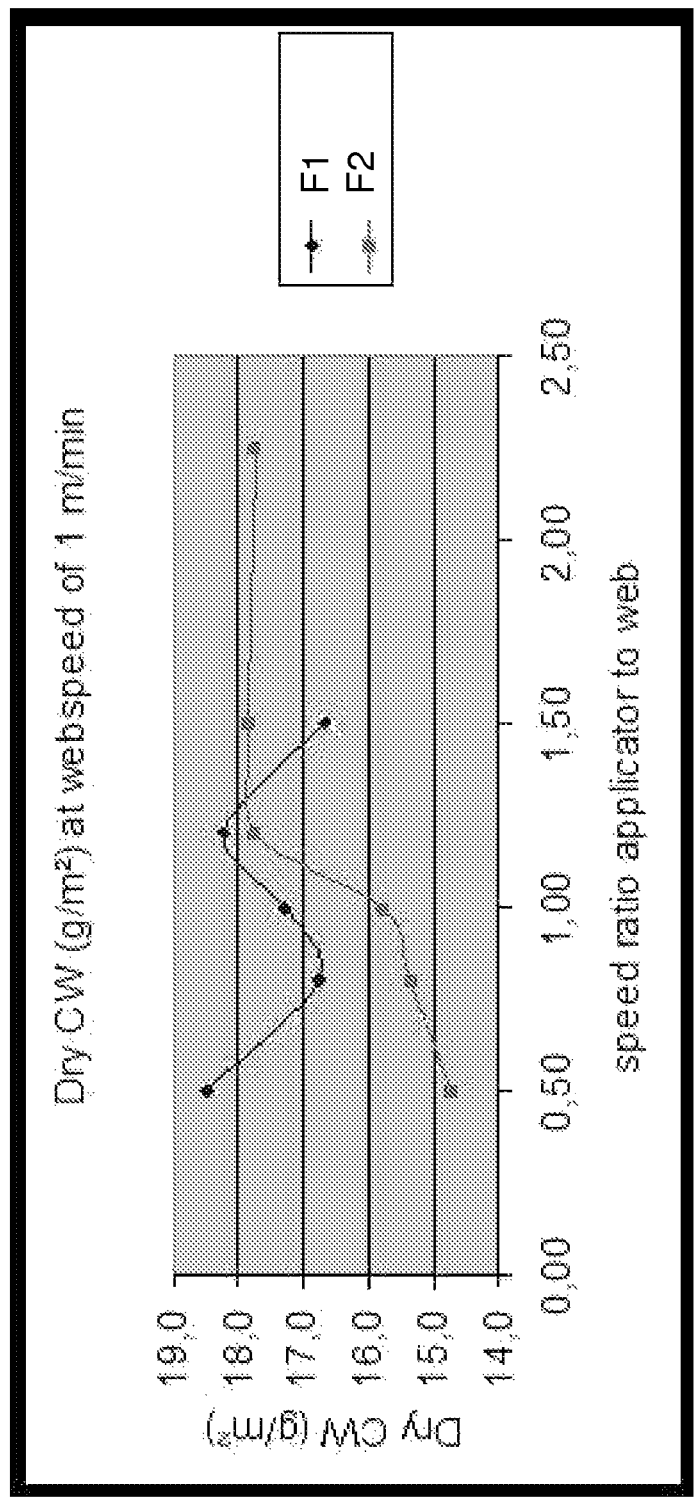
FIG. 5 shows measurement results as obtained in the second production stage.

The resulting dry coating weight was investigated as a function of the speed ratio of the applicator roll 41 relative to the web 1. The applicator roll was rotated in a direction reverse to the direction of transportation of the web. The speed ratio was varied between 0 and 2.5. The measured results for these mixtures are shown in FIG. 5. For the mixture F2 the coating weight increases from about 15 to about 18 g/m$^2$ when the speed ratio is increased from 0.5 to about 1.2. Above a speed ratio of 1.2 the dry coating weight remains substantially constant at about 18 g/m$^2$. For the mixture F1 the coating weight varies between 16.5 and 18.5 g/m$^2$ as a function of the speed ratio.

The resulting organic layer 2 obtained after printing and curing was in the range of 18 to 20 μm for each of the cases described above. The quality of the coatings was verified by a tape adhesion test and a cross-cut adhesion test. The results of the tests are shown in the following table:

| Sample | Tape Adhesion | Cross Cut Adhesion |
|---|---|---|
| OCP on PEN | OK | OK = 5B (100% remains) |
| F2 on PEN | OK | NOK = 0B (>65% removed) |
| F1 on PEN | OK | NOK = 0B (>65% removed) |

Figure 6:
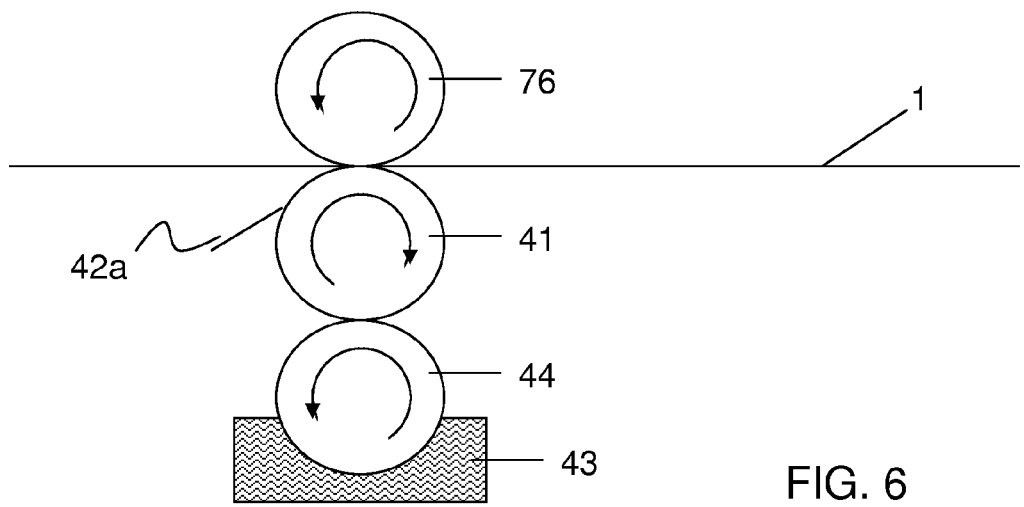
FIG. 6 shows a detail of a fourth embodiment of the apparatus according to the invention.

Each of the coatings passed the tape adhesion test. However only the first coating "OCP on PEN" passed the cross cut adhesion test. It is not necessary that the applicator roll 41 directly transfers the mixture to be printed from the reservoir 43 to the surface of the substrate 1. In an alternative embodiment shown in FIG. 6, the printing mixture is transferred from the reservoir 43 to the applicator roll 41 via a transfer roll 44.

Figure 7:
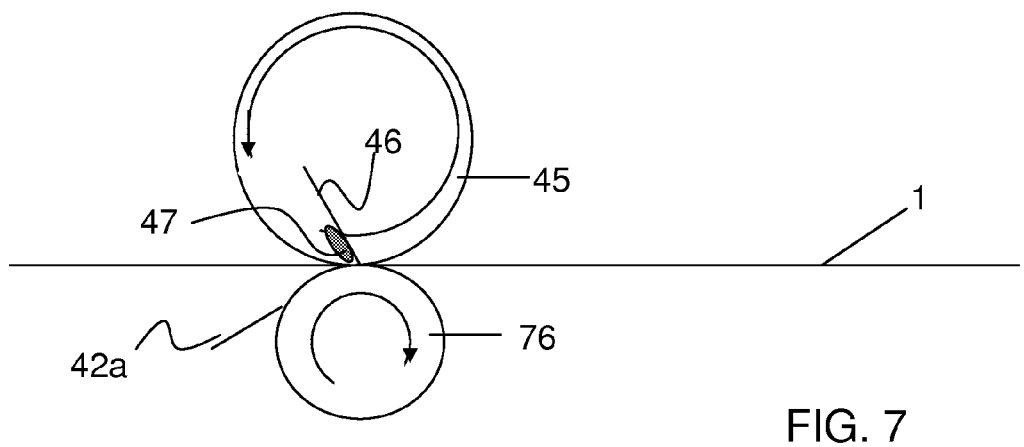
FIG. 7 shows a detail of a fifth embodiment of the apparatus according to the invention, FIG. 8 schematically shows a sixth embodiment of the apparatus according to the invention.

Also other printing methods may be used to apply the organic layer, such as a rotary screen printing. In rotary screen printing, illustrated in FIG. 7, a cylindrical screen 45 is rotated in a fixed position and a squeegee 46 is applied to the inside of the screen 45. The substrate 1 travels at a consistent speed between the screen 45 and a steel or rubber impression roller 76 immediately below the screen 45. As the substrate 1 passes through the rotary unit 45, 76, the screen 45 spins at a rate that identically matches the speed of substrate movement.

The squeegee 46 is in a fixed position and its edge makes contact with the inside surface of the screen 45 precisely at the point where the screen 45, substrate 1, and impression roller 76 come together. The mixture 47 to be printed is automatically fed into the center of the screen 45 and collects in a wedge-shaped "well" formed by the leading side of the squeegee 46 and the interior surface of the screen 45. The motion of the screen 45 causes this bead of the mixture 47 to roll, which forces the mixture into stencil openings, essentially flooding the screen 45 without requiring a floodbar. The squeegee 46 then shears the mixture as the stencil and substrate 1 come into contact, allowing the mixture to transfer cleanly to the material.

Various other printing methods are suitable, such as slot die printing and inkjet printing. Also other deposition methods, such as spray coating are possible. Spray coating however, is not preferred as it tends also to distribute the sprayed substances in the atmosphere of the first compartment 10A, so that a higher pumping speed is required to keep the vapor pressure sufficiently low.

Figure 8:
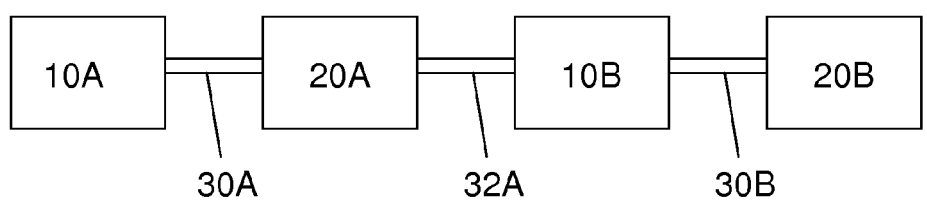

FIG. 8 shows a third embodiment of the apparatus according to the present invention. This embodiment is suitable for applying a plurality of pairs of organic and inorganic layers at the substrate.

The embodiment shown in FIG. 8 comprises a first chamber 10A, a second chamber 20A, a third chamber 10B and a fourth chamber 20B. A flexible substrate to be coated is guided by a facility for guiding (not shown) from the first chamber 10A to the second chamber 20A via a first atmosphere decoupling slot 30A, from the second chamber 20A to the third chamber 10B via a second atmosphere decoupling slot 32A and from the third chamber 10B to the fourth chamber 20B via third atmosphere decoupling slot 30B. The first chamber 10A houses an unwind roller (not shown) for providing a flexible substrate and a printing facility (not shown) for printing the flexible substrate with a mixture comprising at least one precursor for a polymer and a photo initiator and or without sensitizer as well as a curing facility.

The second chamber 20A houses a vapor deposition facility (not shown) for depositing an inorganic layer on the substrate provided with the organic layer. The third chamber 10B again houses a printing facility (not shown) for printing the flexible substrate provided with the organic layer and the inorganic layer with a mixture comprising at least one precursor for a polymer and a photo initiator and or without sensitizer as well as a curing facility for curing the deposited mixture to form a further organic layer. The fourth chamber 20B houses a vapor deposition facility (not shown) for depositing a further inorganic layer.

The printing and curing facilities in the first and the third chamber 10A, 10B, may be the same as the printing and curing facilities described for the first and the second embodiment of the apparatus, or may be another printing facility. The vapor deposition facilities in the second and the fourth chamber 20A, 20B may be same as the vapor deposition facility described for the first and the second embodiment, but alternatively other vapor deposition facilities may be used.

In this way a foil is obtained, subsequently comprising a substrate with a first organic layer, an first inorganic layer, a second organic layer and a second inorganic layer.

In the previous description embodiments are described wherein the one chamber is the first chamber and the other one chamber is the second chamber and wherein the at least first inorganic layer is applied at the at least first organic layer. In other words the flexible substrate is guided along the depositing facility, along the curing facility in the first chamber via the atmosphere decoupling slot along the vapor deposition facility in the second chamber. It is however alternatively possible that the one chamber is the second chamber and the other one chamber is the first chamber. In that case the flexible substrate is guided along the vapor deposition facility in the second chamber via the atmosphere decoupling slot along the depositing facility, along the curing facility in the first chamber. In that case the at least first organic layer is applied at the at least first inorganic layer.

As described with reference to FIG. 8, different apparatuses according to the invention may be chained and if necessary be decoupled by atmosphere decoupling slots. Additional deposition apparatuses may be present for depositing functional layers. For example the chain shown in FIG. 8 may deposit a first barrier structure at a substrate. The substrate with the barrier structure so obtained is subsequently guided, if necessary via an atmosphere decoupling slot, to a further apparatus that deposits a device with one or more functional layers. The substrate provided with the first barrier structure and the functional layers is then guided, if necessary via an atmosphere decoupling slot, to a further apparatus of the invention that deposits a second barrier structure that together with the first barrier structure encapsulates the functional layers. The deposited device is for example an (O)LED, an (organic) photovoltaic cell an electrochrome device or a battery.

While the invention has been illustrated and described in detail in the drawings and foregoing description, such illustration and description are to be considered illustrative and exemplary and not restrictive; the invention is not limited to the disclosed embodiments.

Other variations to the disclosed embodiments can be understood and effected by those skilled in the art in practicing the claimed invention, from a study of the drawings, the disclosure and the appended claims. In the claims the word "comprising" does not exclude other elements or steps, and the indefinite article "a" or "an" does not exclude a plurality. A single processor or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. An apparatus for coating a flexible substrate with at least a first organic layer and a first inorganic layer, the apparatus comprising
    a first and a second chamber,
    an atmosphere decoupling slot between the first and the second chamber,
    a deposition facility arranged in the first chamber, for depositing a curable mixture, the curable mixture comprising at least one precursor of a polymer, an oligomer or a polymer network and/or an initiator of polymerization,
    a curing facility arranged in the first chamber, for curing the deposited mixture, therewith forming the at least first organic layer,
    a condensation channel arranged between the first chamber and the atmosphere decoupling slot, the condensation channel being configured to cause vapors from the first chamber to condensate before the vapors enter the atmospheric decoupling slot,
    a vapor deposition facility arranged in the second chamber, for depositing the at least first inorganic layer, the vapor deposition facility including a cooling drum arranged inside said second chamber,
    a facility for guiding the flexible substrate from the second chamber via the atmosphere decoupling slot to the first chamber, wherein the at least first organic layer is applied at the at least first inorganic layer, characterized in that the length L of the atmosphere decoupling slot divided by the height of the atmosphere decoupling slot is in a range between 100 and 5000.

2. The apparatus according to claim 1, wherein the depositing facility is a printing facility.

3. The apparatus according to claim 2, wherein the printing facility is a contact printing facility.

4. The apparatus according to claim 1, wherein the atmosphere decoupling slot comprises one or more evacuation channels that are coupled to an evacuation device.

5. The apparatus according to claim 1, wherein the atmosphere decoupling slot comprises one or more pairs of cylindrical rollers between which the flexible substrate is guided.

6. The apparatus according to claim 1, wherein the atmosphere decoupling slot has a height in the range of 1.5 to 5 times the thickness of the flexible substrate.

7. The apparatus according to claim 2, wherein the printing facility is a slot die printing facility.

* * * * *